(12) United States Patent
Benson

(10) Patent No.: US 8,857,714 B2
(45) Date of Patent: Oct. 14, 2014

(54) BALLISTIC SIGHT SYSTEM

(75) Inventor: Robert G. Benson, New Ipswich, NH (US)

(73) Assignee: FLIR Systems, Inc., Wilsonville, OR (US)

( * ) Notice: Subject to any disclaimer, the term of this patent is extended or adjusted under 35 U.S.C. 154(b) by 97 days.

(21) Appl. No.: 13/562,079

(22) Filed: Jul. 30, 2012

(65) Prior Publication Data
US 2014/0110483 A1 Apr. 24, 2014

Related U.S. Application Data

(60) Provisional application No. 61/611,052, filed on Mar. 15, 2012.

(51) Int. Cl.
*G06F 19/00* (2011.01)
*G06G 7/80* (2006.01)
*F41G 1/387* (2006.01)
*G05B 1/01* (2006.01)
*F41G 1/38* (2006.01)
*H01L 23/00* (2006.01)

(52) U.S. Cl.
CPC *F41G 1/38* (2013.01); *F41G 1/387* (2013.01); *G05B 1/01* (2013.01); *H01L 23/576* (2013.01)
USPC .............................. 235/404; 235/400; 235/407

(58) Field of Classification Search
CPC ......... F41G 1/38; F41G 3/165; F41G 11/003; F41G 1/35; F41G 5/06; F41G 11/001; F41G 1/473; F41G 1/54; F41G 3/02; F41G 3/06; F41G 3/08; F41G 1/30; F41G 1/32; F41G 1/345; F41G 1/387; F41G 3/00; F41G 3/14; F41G 3/142; F41G 3/145; F41G 3/147; F41G 3/262
USPC .................................................. 235/400, 404
See application file for complete search history.

(56) References Cited

U.S. PATENT DOCUMENTS

| | | |
|---|---|---|
| 2009/0040308 A1* | 2/2009 | Temovskiy .................... 348/158 |
| 2009/0205239 A1* | 8/2009 | Smith, III ....................... 42/122 |
| 2010/0324437 A1* | 12/2010 | Freeman et al. ............... 600/529 |
| 2011/0173869 A1* | 7/2011 | Uhm ............................... 42/111 |
| 2011/0207089 A1* | 8/2011 | Lagettie et al. .................. 434/22 |
| 2011/0315767 A1* | 12/2011 | Lowrance ..................... 235/404 |
| 2012/0097741 A1* | 4/2012 | Karcher ....................... 235/404 |
| 2012/0126002 A1* | 5/2012 | Rudich ........................ 235/404 |
| 2012/0240444 A1* | 9/2012 | Russell ............................ 42/90 |
| 2013/0097912 A1* | 4/2013 | Craven et al. .................. 42/124 |

* cited by examiner

*Primary Examiner* — Tuyen K Vo
(74) *Attorney, Agent, or Firm* — Haynes and Boone, LLP

(57) ABSTRACT

A system can include a camera configured to mount to a firearm and a scope configured to mount to the firearm. A display can be configured to show an image from the camera. The scope can be configured to view the display. The image from the camera can be electronically movable relative to scope and camera to facilitate compensation for bullet drop and windage. Moving the image can allow use of higher scope magnification and/or electronic camera zoom.

22 Claims, 16 Drawing Sheets

NORMAL SCOPE USE

EXTREME DISTANCE SCOPE USE

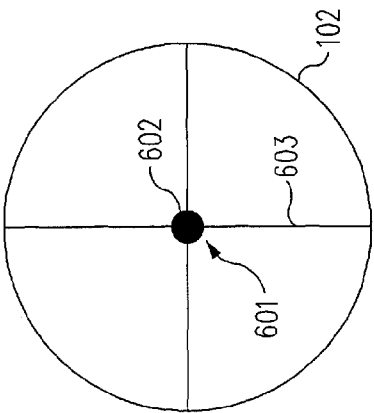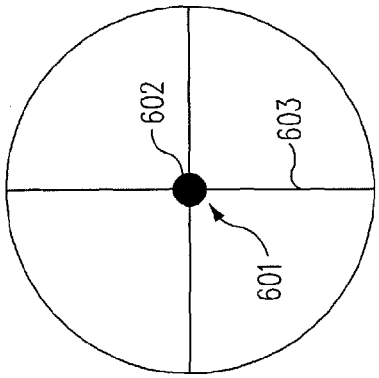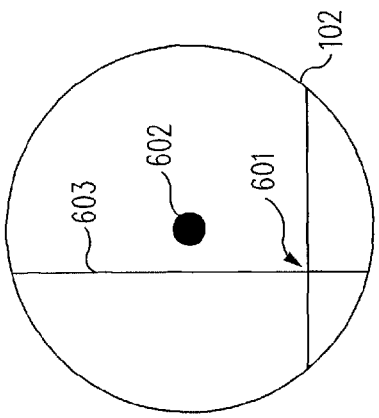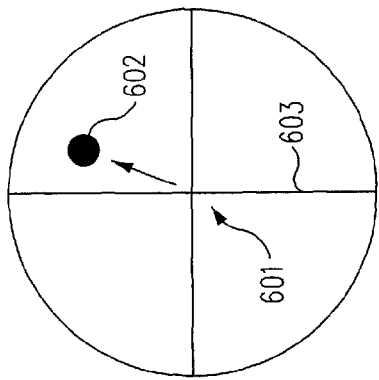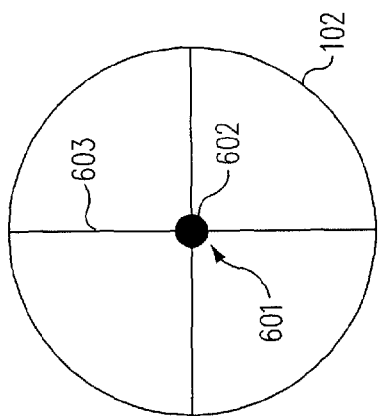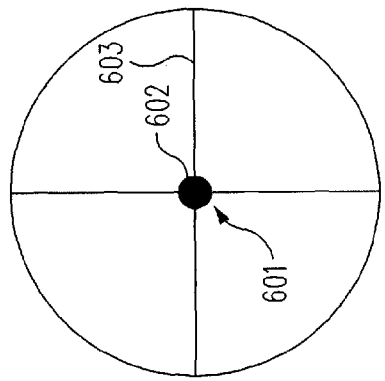

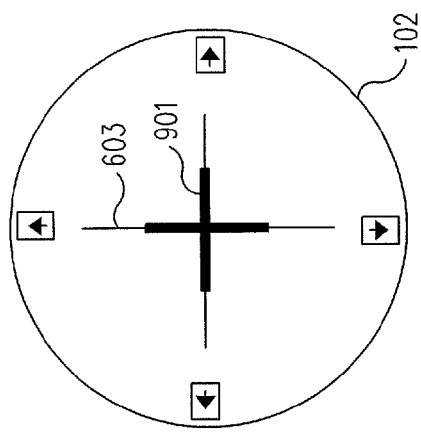
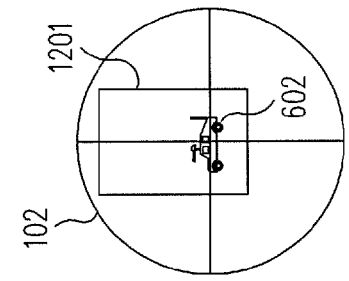
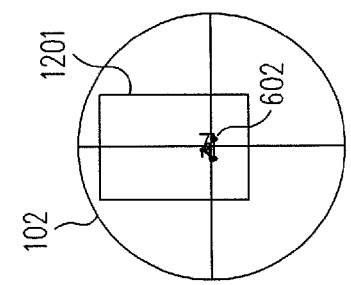
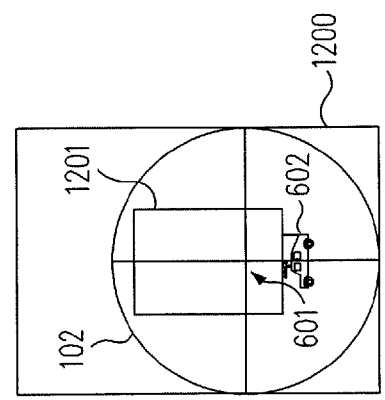
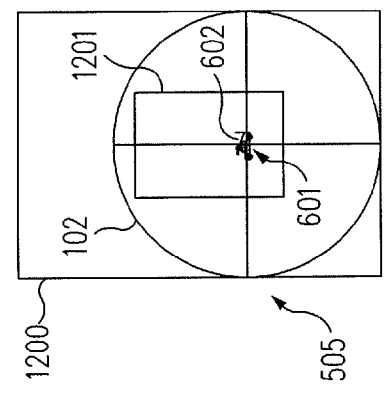

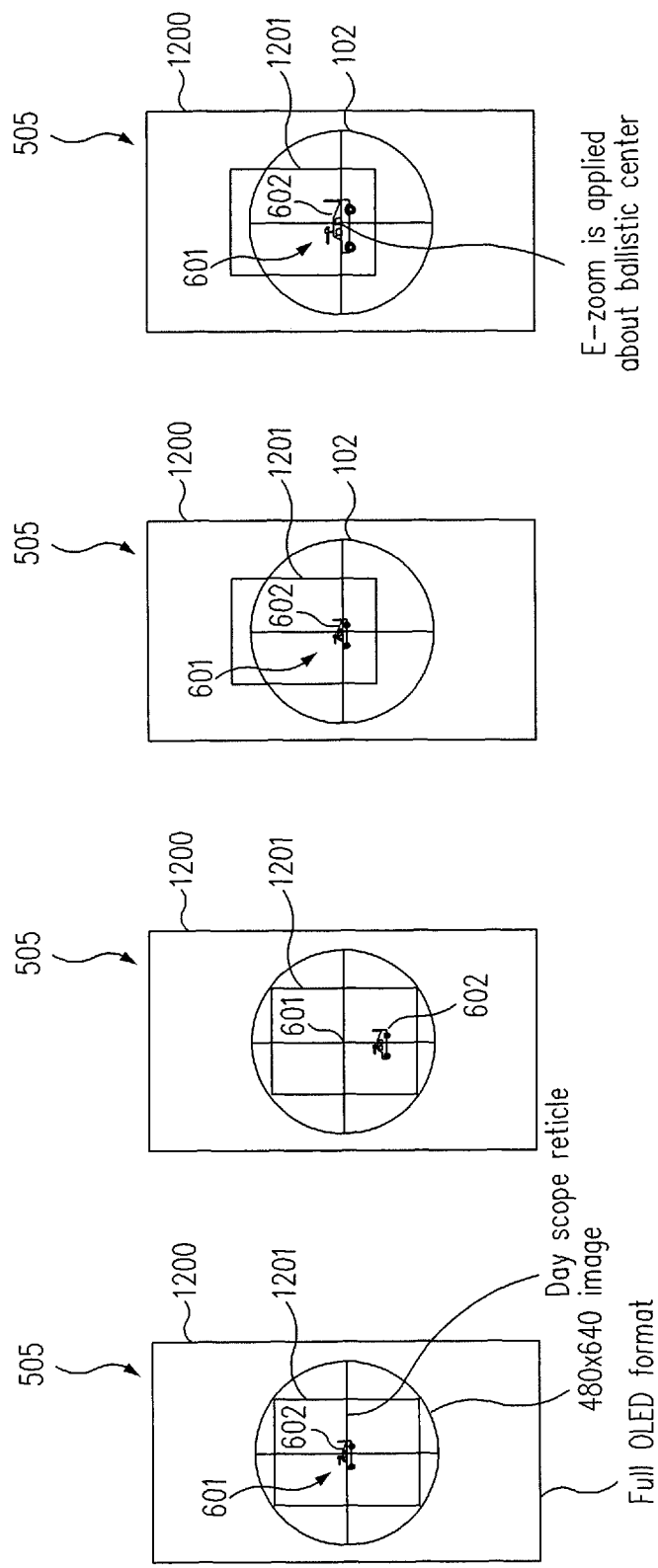

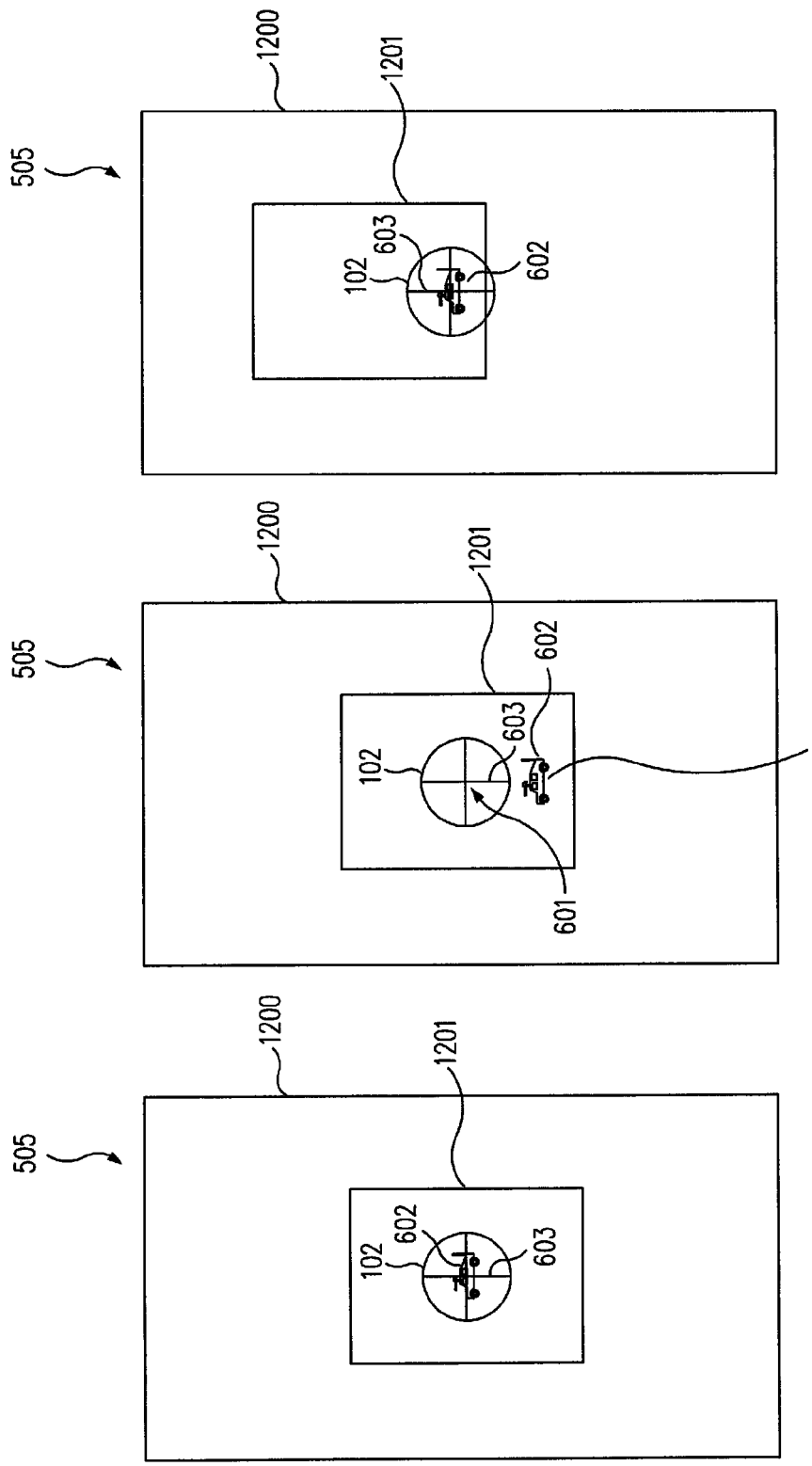

BALLISTIC SIGHT SYSTEM

CROSS-REFERENCE TO RELATED APPLICATIONS

This patent application claims priority to and the benefit of U.S. Patent Application No. 61/611,502, filed Mar. 15, 2012, which is incorporated herein by reference in its entirety.

TECHNICAL FIELD

One or more embodiments of the invention relate generally to firearms and, more particularly, to a sighting system for firearms wherein enhanced bullet drop and windage compensation can be provided.

BACKGROUND

Scopes are commonly used on high powered rifles for shooting targets at long distances. Such scopes provide magnification that allows a shooter to more easily see the target and more easily aim the rifle. Thus, the use of scopes can enhance the accuracy of the rifle.

Bullet drop and windage adjustments are often required to compensate for bullet movement in flight. The bullet movement tends to move the bullet off target. Gravity pulls the bullet downward and thus causes bullet drop. Wind tends to move the bullet sideways. Bullet drop and windage compensation become more important as the distance to the target increases.

The bullet drop and windage compensations adjustments for a scope are made via the use of adjustment knobs on the scope. These adjustments reposition a scope reticle. After the bullet drop and windage compensations adjustments have been made, a crosshair of the scope reticle defines the rifle's bullet impact point (at a predetermined distance to the target). That is, bullet drop and windage are compensated for such that when the crosshair is placed over the target, a bullet fired from the rifle will hit the target. Thus, by moving the reticle, the shooter can change the rifle's aim point in a manner that compensates for bullet drop and windage.

When shooting at extremely long distances or under very windy conditions, extreme bullet drop and windage adjustments can be required. The bullet drop and windage adjustments can be so large that the crosshair cannot be moved far enough to fully compensate (such adjustment would require that the crosshair move out of the sight picture of the scope, which the crosshair cannot do). Under such conditions, aiming of the firearm cannot be done in the desired normal manner, i.e., by placing the crosshair on the target.

Additionally, the use of cameras on firearms is known. For example, a thermal imaging camera can be added to a rifle for enhanced nighttime capability. The thermal imaging camera provides a thermal image of a target in low light or no light conditions. The thermal image is converted into visible light and the target image is viewed on a display. The target image can be used for aiming the firearm at the target. However, there is need for an improved sight system to provide greater bullet drop and windage compensation adjustment.

SUMMARY

Methods and systems are provided for one or more embodiments to allow a shooter to compensate for windage and/or bullet drop when shooting at targets which are a large distance from the shooter. For example, larger shooting distances and greater wind compensation can be more readily accommodated than when using a contemporary sighting system.

According to an embodiment, a system can include a camera, such as a thermal imaging camera, configured to mount to a firearm and a scope configured to mount to the firearm. A display can be configured to show an image from the camera. The scope can be configured to view the display. The image from the camera can be movable to facilitate greater compensation for bullet drop and windage than a compensation for bullet drop and windage provided by the scope.

According to an embodiment, a system can include a camera mounted to the firearm and a scope mounted to the firearm. The camera can have a display configured to show an image from the camera. The scope can be aligned to the camera and can be configured to view the display. A field of view of the camera can be wider than a field of view the scope and the image from the camera can be movable to facilitate greater compensation for bullet drop and windage that a compensation provided by the scope. A reticle of the scope can be configured to cooperate with the image to facilitate aiming of the firearm.

According to an embodiment, a method can include mounting a scope to a firearm, aligning the scope to the firearm, mounting a camera to the firearm, and aligning the camera to the scope. The camera can have a display configured to show an image from the camera. The scope can be configured to view the display. A field of view of the camera can be wider than a field of view the scope. The image from the camera can be movable to facilitate greater compensation for bullet drop and windage that a compensation provided by the scope.

According to an embodiment, a method can include turning a camera from a normal mode to a ballistic mode and aiming a firearm at a target by placing a crosshair of a scope on an image of the target displayed by the camera. In the normal mode, the image from the camera can remain stationary as bullet drop and windage compensation are entered (such as via the scope). In the ballistic mode, the image can be movable to facilitate greater compensation for bullet drop and windage than a compensation provided by the scope. In the ballistic mode, the bullet drop and windage compensation are entered into the camera so as to cause the image to move in a manner that provides bullet drop and windage compensation.

According to an embodiment, ballistic mode only operation can be provided. The normal mode can be omitted. The use of the ballistic mode does not require the use or presence of the normal mode.

The methods and systems disclosed herein better facilitate shooting at targets, such as in combat situations. More particularly, the methods and systems disclosed herein better facilitate the aiming of high power rifles at targets which are at great distances from the shooter. These methods and systems also better facilitate shooting in high winds, and under limited light conditions, such as at night.

The invention disclosed herein is defined by the claims, which are incorporated into this Summary by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 8A-8F show use of the ballistic sight system, in accordance with an embodiment of the invention.

FIG. 9 shows a view through the scope during calibration when a reticule of the camera is aligned with a reticule of the scope, in accordance with an embodiment of the invention.

FIGS. 10A and 10B show an electronic zoom of the camera when the system is not calibrated with respect to the scope, in accordance with an embodiment of the invention.

FIGS. 11A and 11B show an electronic zoom of the camera when the system is calibrated with respect to the scope, in accordance with an embodiment of the invention.

FIGS. 12A-12D show a use of the ballistic sight system with 5× scope magnification when compensating for bullet drop, in accordance with an embodiment of the invention.

FIGS. 13A-13C show a use of the ballistic sight system with 25× scope magnification when compensating for bullet drop, in accordance with an embodiment of the invention.

Embodiments of the invention and their advantages are best understood by referring to the detailed description that follows. It should be appreciated that like reference numerals are used to identify like elements illustrated in one or more of the figures.

DETAILED DESCRIPTION

Methods and systems are provided for facilitating shooting with a scope when a target is at a large distance, e.g., on the order of 2,000 yards, from the shooter. When the target is at such a distance from the shooter, and the scope is used at high magnification, a scope reticule cannot be moved far enough to compensate for windage and/or bullet drop (e.g., under certain conditions). That is, at such distances, the scope reticule bottoms out or hits internal stops such that sufficient windage and/or bullet drop corrections cannot be applied. Thus, the scope cannot be adjusted such that placing a crosshair of the reticule on the target will result in a hit.

According to contemporary practice, in such instances the shooter can use reticule markings other than the crosshair as an alternate means to achieve bullet drop compensation (BDC). For example, the shooter can use tick marks below the crosshair to compensate for bullet drop when aiming at such a distant target. Similar marks may be provided on the reticule for windage.

However, it is generally undesirable to use reticule markings other than the crosshair when shooting at long distances. Using the tick marks requires that the shooter determine which of the tick marks to use and that the shooter actually use the correct tick marks when shooting. Further, the aim point may not actually be at a particular tick mark, but rather may be between tick marks or off to the side of the tick marks. Determining the correct tick mark and then using the tick mark correctly can be very difficult, especially in combat situations. Mistakes can be made too easily and can have serious consequences.

According to an embodiment, the target can be kept approximately centered in a field of view of the scope by moving an intermediate image. Keeping the target centered in the field of view of the scope can eliminate the need to enter bullet drop and windage corrections via the scope. The intermediate image can be an image from a camera, such as a thermal imaging camera, for example. The image can be moved to compensate for bullet drop and windage. The camera can have a wider field of view than the scope, such that the image can be move farther than the scope reticule can be moved. Thus, more bullet drop and windage compensation can be provided by moving the image than by moving the reticule.

Figure 1:
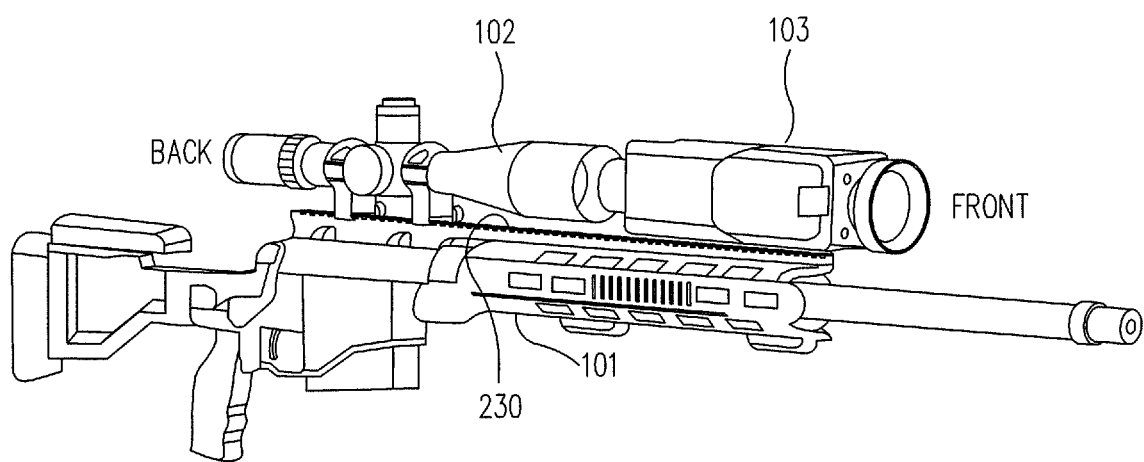
FIG. 1 shows a ballistic sight system for a rifle, in accordance with an embodiment of the invention.

FIG. 1 shows a ballistic sight system that includes a rifle 101, a scope 102, and a camera 103, in accordance with an embodiment of the invention. The rifle 101 can be a sniper rifle, such as a 50 caliber Barrett M82A1 or an M107 Long Range Sniper Rifle (LRSR), for example. Although the ballistic sight system is particularly well suited for use with high power, long range rifles, the ballistic sight system can be used with any rifle, handgun or other type of firearm provided in any caliber.

The scope 102 and the camera 103 can mount in line with each other on the firearm 101. Thus, the scope 102 can view an image provided by the camera 103, such as upon a display 505 (FIG. 5) disposed at a rear end of the camera 103.

Alternatively, the camera 103 and the scope 102 can mount side-by-side or one atop the other as long as they are pointed in the same direction. Optics can be provided to facilitate viewing of the display 505 via the scope 102 and/or the display 505 can be disposed at a location other than upon the camera 103. The camera 102 and the scope 103 can mount in any desired fashion.

The scope 102 can be any scope that is compatible for use with the rifle 101. The scope can be a unity power scope, a low power scope, or a high power scope. For example, the scope 102 can be a Leupold 4.5-14×50 Mark 4 scope.

The camera 103 can be a thermal imaging camera. The camera can be visible light camera, ultraviolet camera, infrared camera (such as a thermal infrared camera, a non-thermal infrared camera, near infrared camera, a far infrared camera, a short wavelength infrared camera, a medium wavelength infrared camera, or a long wavelength infrared camera) or any other type of camera. The camera can be any type of camera that can provide an image of a target 602 (FIG. 6).

The camera 103 can be used with passive or active illumination. The camera can be used with natural illumination such as sunlight, starlight, or moonlight. The camera can be used with artificial illumination, such illumination provided by an infrared light source.

The camera 103 can have a normal mode in which the image is fixed and can a ballistic mode in which the image moves to keep a bullet impact point, e.g., the target 602, approximately centered within a view of the scope 102.

Thus, in the ballistic mode the image can be moved to compensate for bullet drop and windage, rather than moving the scope reticule 603 (FIG. 6). The camera 103 can be configured to be switched from the normal mode to the ballistic mode, such as when the scope reticule 603 cannot move sufficiently to place a crosshair 601 of the scope reticule 603 on the target 602 due to the amount of windage and/or bullet drop compensation required at a longer shooting distance.

Figure 2:
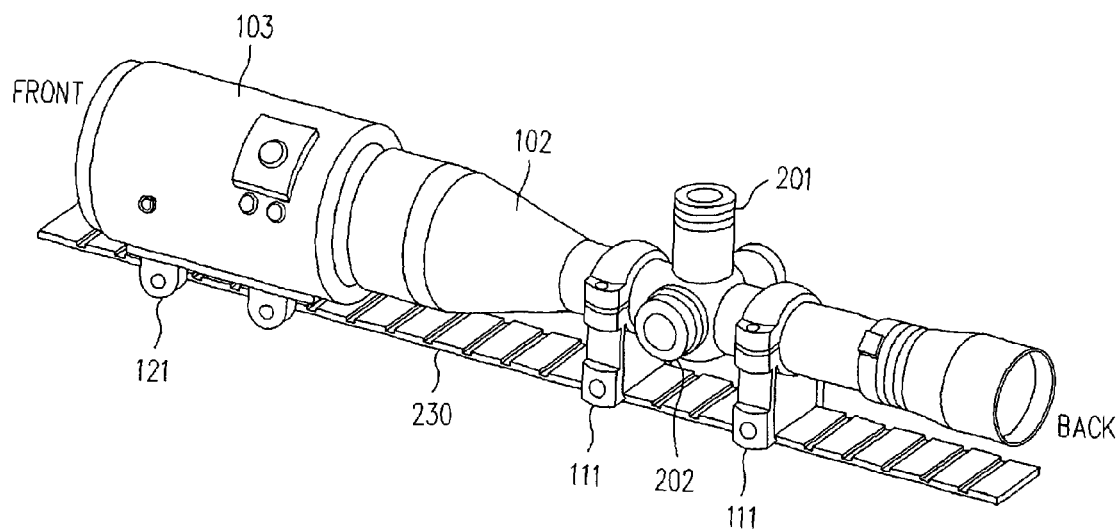
FIG. 2 shows an enlarged view of a scope and a camera of the ballistic sight system, in accordance with an embodiment of the invention.

FIG. 2 shows an enlarged view of the scope 102 and the camera 103 of FIG. 1, in accordance with an embodiment of the invention. The scope 102 can have a vertical or bullet drop compensation adjustment 201 and a horizontal or windage compensation adjustment 202. The scope 102 can be an unmodified, off the shelf, rifle scope.

The scope 102 can attach to the rifle 101 via scope mounts 111. The scope 102 can attach to the rifle 101 in any desired manner. The camera 103 can attach to the rifle 101 via camera mount 121. The camera 103 can attach to the rifle 101 in any desired manner. For example, both the scope 102 and the camera 103 can attach to the rifle 101 via a Picatinny rail 230.

The camera 103 can mate or mechanically attach to the scope 102, such as to define an integrated scope/camera assembly. In this instance, the mated scope 102 and camera 103 can attach to the rifle 101 via either the scope 102 or the camera 103 alone.

Thus, the scope 102 and the camera 103 can be two separate components that are not attached directly to one another. The scope 102 and the camera 103 can each attach separately to the rifle 101.

Figure 3:
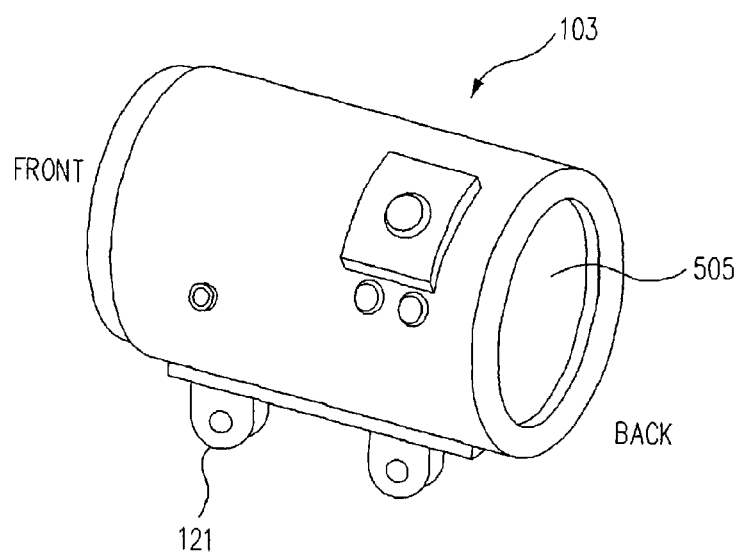
FIG. 3 shows an enlarged view of the camera, in accordance with an embodiment of the invention.

FIG. 3 shows an enlarged view of the camera 103, in accordance with an embodiment of the invention. The camera 103 can receive light, such as from the target 602, at the front of the camera 103. The camera 103 can provide an image, such as of the target 602, on a display 505 at the back of the camera 103.

Figure 4:
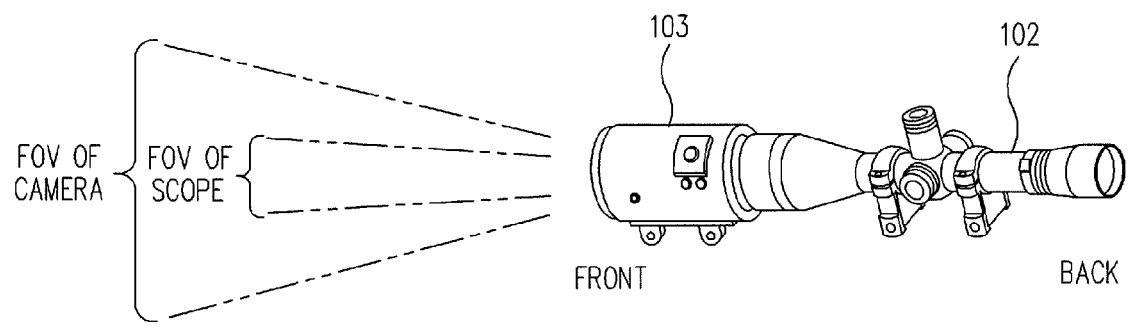
FIG. 4 shows a field of view of the scope and a field of view of the camera, in accordance with an embodiment of the invention.

FIG. 4 shows a field of view of the scope 102 and a field of view of the camera 103, in accordance with an embodiment of the invention. As can be seen, the field of view of the camera 103 can be substantially greater than the field of view of the scope 102. The field of view of the camera 103 is greater than the field of view of the scope 102 when the scope 102 is zoomed in. The field of view of the camera 103 can be less than, equal to or greater than the field of view of the scope 102 when the scope 102 is zoomed out.

Since the field of view of the camera 103 is greater than the field of view of the scope 102, the camera 103 can provide an image that includes more of a scene surrounding the target 603. Thus, the camera 103 can provide an image of an aim point that is outside of the view of the scope 102. The ability of the camera 103 to show such aim points can be beneficial when bullet drop and/or windage compensation place an aim point outside of the view of the scope 102.

A shooter can sometimes zoom the scope 102 out to provide less magnification and can thus bring the aim point back into view of the scope 102. However, it is often difficult, inconvenient, or impossible for the shooter to zoom the scope 102 out sufficiently to bring the aim point back into view of the scope 102.

Figure 5:
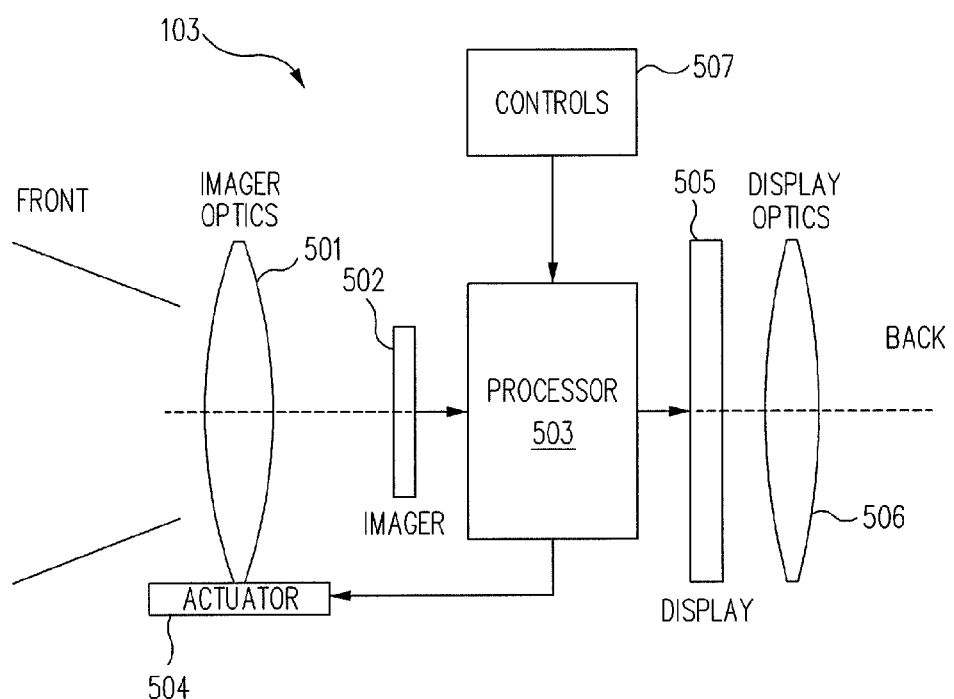
FIG. 5 shows a block diagram of the camera, in accordance with an embodiment of the invention.

FIG. 5 shows a block diagram illustrating the camera 103, in accordance with an embodiment of the invention. The camera 103 can have imager optics 501 that focus light upon an imager 502. The imager 502 can be a charge coupled device (CCD) imager, a complimentary metal oxide (CMOS) imager, a cryo-cooled indium antimonide (InSb) imager, or a microbolometer for example. The imager optics 501 can contain one or more optical elements, such as lenses, for focusing and/or zooming the camera 103.

The imager 502 can provide an electronic signal to a processor 503. The processor 503 can be a general purpose processor, a dedicated processor, or any other type of processor. The processor 503 can control functions of the camera 103, such as focusing, zooming, and image position. For example, the processor 503 can move one or more lenses of the imager optic 501 via an actuator 504 to effect focusing and zooming.

The processor 503 can provide an electronic output to the display 505. The display 505 can show the image captured by the imager 502. The processor 503 can control the position of the image, e.g., the target 602, on the display 505, can add a camera reticule (FIG. 9) to the image shown on display 505, and can electronically zoom the image on the display 505.

The display 505 can be an organic light emitting diode (OLED) display, a light emitting diode (LED) display, or a liquid crystal display (LCD). The display 505 can be any other type of display. The display 505 can be a high resolution (OLED) display. For example, the display 505 can have a resolution of 600×1024, 480×800, 800×1280, 1746×1000, 1024×1024, 2048×2048 or more. The display 505 can have any desired resolution.

Generally, the use of a higher resolution display 505 is desired. The use of a higher resolution display 505 better facilitates the use of only a portion of the display 505 for viewing by the scope 102. By using a higher resolution display 505, better resolution is available for that portion of the display 505 being viewed by the scope 102.

Display optics 506 can be provided to optically match the display to the scope 102, if needed. The display optics 506 can facilitate focusing of the scope 102 on the display 505 such that the image shown upon the display 505 is in focus and can be seen by the shooter through the scope 102.

The processor 503 can be configured to move the image in a manner that compensates for bullet drop and windage. More particularly, the processor 503, when operating in the ballistic mode, can keep the target 602 approximately centered in a view of the scope 102 as bullet drop and windage compensations are entered into the camera 103. The processor 503 can keep the target 602 approximately centered in a view of the scope 102 as bullet drop and windage compensations are entered into the camera 103 even though the bullet drop and windage compensations are of such a magnitude that the corrections would cause the reticle of the scope 102 to bottom out, thus rendering the scope 102 difficult to use or altogether unusable.

The processor 503 can be configured to electronically zoom the image, to maintain a bullet impact point of the image approximately centered in the field of view of the scope 102 as the image is zoomed, and to upsample the image as the image is zoomed. The processor 503 can have any desired functionality, including functionalities other than the practice of the present disclosure.

The processor 503 and the controls 507 can be part of the camera 103. The processor 503 and the controls 507 can be separate from the camera 103 and can be disposed at any desired location upon the rifle 101, upon the shooter, or anywhere else.

The shooter can use the controls 507, e.g., a joystick, to enter bullet drop and windage corrections into the processor 503 and processor 503 can move the image on the display 505 in response to the joystick to keep the bullet impact point approximately centered within the field of view of the camera 103 in response to the bullet drop and windage corrections.

As the shooter enters the bullet drop and windage corrections, the bullet drop and windage corrections can be shown on the display 505. For example, the bullet drop and windage corrections can be shown on the display 505 numerically as mils.

Figure 6C:
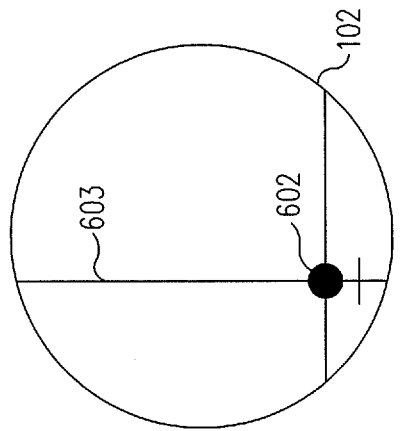
FIGS. 6A-6C show views through the scope during contemporary use (without the camera) wherein a crosshair of the scope is placed over a target to aim the rifle at shorter distances.
Figure 6B:
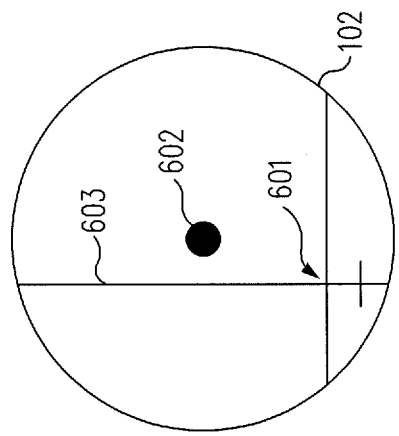
Figure 6A:
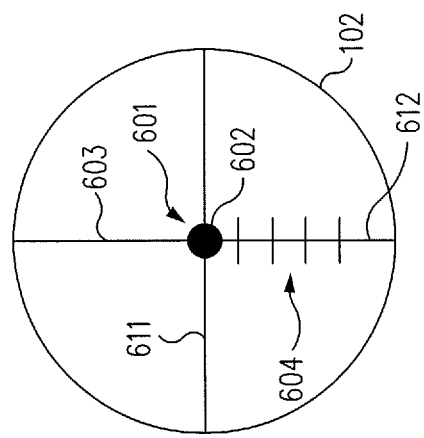

FIGS. 6A-6C show views through the scope 102 during contemporary use (without the camera 103 being attached to the rifle 101) wherein a crosshair 601 of the scope 102 is placed over a target 602 (both as best shown in FIG. 6B) to aim the rifle 101 when shooting at shorter distances. The distances are sufficiently short that the crosshair 601 can be used to aim the rifle 101. Thus, the distances are sufficiently short that the ballistic mode need not be used. However, the ballistic mode can be used at any distance.

The scope reticule 603 of the scope 102 defines the crosshair 601, generally proximate the center of the reticule 603. The crosshair 601 is defined as that portion of the reticule 603 wherein the horizontal member 611 and the vertical member 612 of the reticule cross one another. The reticule 603 can include a plurality of tick marks, such as bullet drop tick marks 604 on the vertical member 612. Windage tick marks (not shown) can similarly be provided on the horizontal member 611 of the reticule 603. Various other configurations of the reticule 603 are in common use.

With particular reference to FIG. 6A, the reticule 603 and the crosshair 601 of the reticule 603 are generally centered in the view of the scope 102 when no bullet drop or windage compensation is applied to the scope 102. When no bullet drop or windage compensation is needed, the crosshair 601 can simply be placed over the target 602 to aim the rifle 101.

With particular reference to FIG. 6B, the reticule 603 and the crosshair 601 of the reticule 603 are moved away from their generally centered positions when bullet drop and windage compensation are applied to the scope 102, such as by turning the bullet drop compensation adjustment 201 and windage compensation adjustment 202. When bullet drop or windage compensation are applied to the scope 102, then the crosshair 601 is moved within the view of the scope 102, so that the rifle 101 can be re-aimed in a manner that compensates for bullet drop and/or windage so as to cause a bullet fired from the rifle 101 to hit the target 602.

With particular reference to FIG. 6C, the crosshair 601 has been moved within the view of the scope 102 by applying bullet drop and windage compensation, as discussed above. After applying bullet drop and windage compensation, the rifle 101 can be re-aimed (such as by moving the aim point of the rifle 101 up and to the right) in a manner that compensates for bullet drop and/or windage, so as to cause a bullet fired from the rifle 101 to hit the target 602.

Figure 7A:
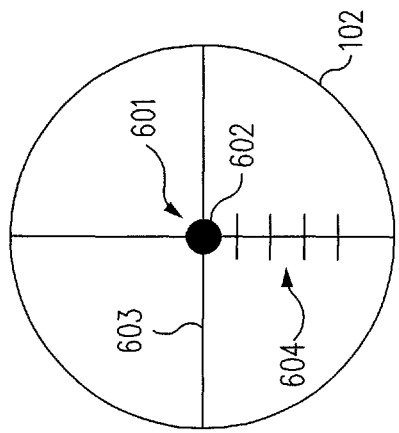
FIGS. 7A-7C show views through the scope during contemporary use (without the camera) wherein a tick mark of the scope is placed over the target to aim the rifle at longer distances.
Figure 7B:
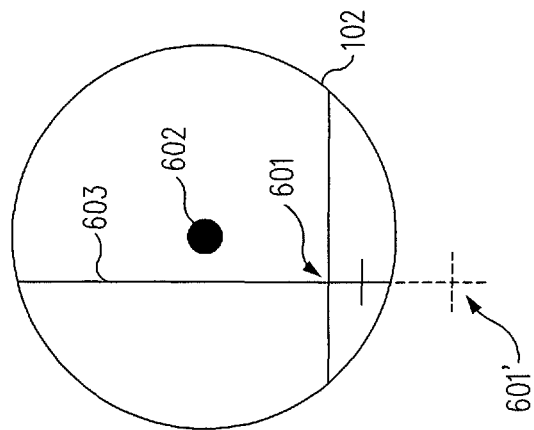
Figure 7C:
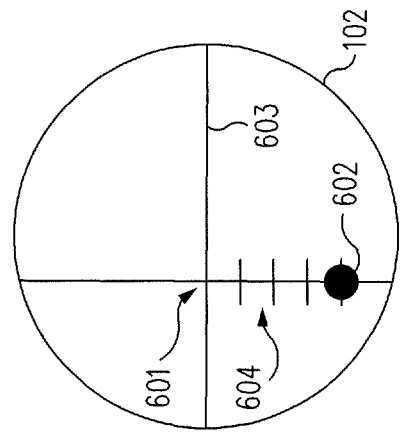

FIGS. 7A-7C show views through the scope during contemporary use (without the camera 103 being attached to the rifle 101) wherein a tick mark 604 of the reticule 603 is placed over the target 602 to aim the rifle 101 at longer distances. The distances are sufficiently long that the crosshair 601 cannot be used to aim the rifle 101 in the manner shown in FIGS. 6A-6C.

With particular reference to FIG. 7A, the reticule 603 and the crosshair 601 of the reticule 603 are generally centered in the center of the view of the scope 102 when no bullet drop or windage compensation is applied to the scope 102. When no bullet drop or windage compensation is needed, the crosshair 601 can simply be place over the target 602 to aim the rifle 101. However, in this example substantial bullet drop compensation is needed such that the bullet drop compensation will move the crosshair 601 away from the target 602, as discussed with respect to FIG. 7B below.

With particular reference to FIG. 7B, the reticule 603 and the crosshair 601 of the reticule 603 are moved away from their generally centered positions when bullet drop and windage compensation are applied to the scope 102 by turning the bullet drop compensation adjustment 201 and windage compensation adjustment 202. In this instance, the target 602 is so far away that sufficient bullet drop compensation cannot be provided by moving the reticule 603. That is, the reticule 603 cannot physically move far enough to provide the required bullet drop compensation. Moving the reticule 603 far enough to provide the required bullet drop compensation would require that the reticule 603 be moved downwardly so far that the crosshair 601 would be outside of the view of the scope 102, as shown by the phantom crosshair 601. Of course, requiring that the crosshair 601 be outside of the view of the scope 102 prevents the reticule 603 from being used in the manner shown in FIGS. 6A-6C.

With particular reference to FIG. 7C, one of the tick marks 604 can be used in place of the crosshair 601 when the required bullet drop compensation is greater than the scope 102 can accommodate. That is, the appropriate tick mark 604 can be placed over the target 602 to facilitate shooting at large distances. In this manner, the appropriate tick mark 604 can be used in a manner similar to the way in which the crosshair 601 is generally used.

However, the use of such tick marks 604 has several disadvantages. Any previously applied bullet drop compensation must be either backed out or included in the calculation for bullet drop compensation. The correct tick mark must be calculated to properly compensate for bullet drop. The correct tick mark must be used when aiming. It can be very difficult to do all of these things correctly, particularly in combat situations. Additionally, the compensation that can be provided by the use of tick marks is limited.

FIGS. 8A-8F show use of the ballistic sight system, in accordance with an embodiment of the invention. The camera 103, such as a thermal imaging camera, is mounted on the rifle 101 such that the scope 102 can view the display 505 (FIG. 5) of the camera 103. According to an embodiment, the scope 102 must be aligned with respect to the rifle 101. The camera 103 can be aligned to the scope 102.

FIGS. 8A-8C show views through the scope 102 with the ballistic mode off and FIGS. 8D-8F shown views through the scope 102 with the ballistic mode on. With the ballistic mode off, the views through the scope 102 can be similar to views through the scope 102 without the camera 103 attached to the rifle 101, particularly if the camera 103 has unity magnification and is well aligned with respect to the scope 102. Thus, with the ballistic mode off, the camera 103 can simply show an image, e.g., the target 602, without shifting the image in response to bullet drop and windage compensation. With the ballistic mode off, the reticule 603 can be use to aim the rifle 101, as discussed above.

With the ballistic mode on, the views through the scope 102 can be similar to views through the scope 102 without the camera 103 attached to the rifle 101, until bullet drop and windage compensation are entered. When bullet drop and windage compensation are entered, the image provided by the display 505 and viewed through the scope 102 shifts. The amount of such shift is proportional to the magnitude of the bullet drop and windage compensation entered.

The shooter can turn the ballistic mode off and on. The ballistic mode can be turned on automatically in response to an attempt to use bullet drop and/or windage compensation greater than the scope 102 can accommodate. The scope 102 can cooperate, such as electronically, with the camera 103 to facilitate such automatic operation.

With the ballistic sight system, no tick marks 604 (such as those of FIGS. 6A-7C) are required on the reticule 603 of the scope 102 since more extreme bullet drop and windage compensation is applied by moving the image shown in the display 505 of the camera 103 rather than by using the tick marks 604. With the ballistic sight system, the reticule 603 of the scope 102 can have the tick marks 604 or the tick marks 604 can be omitted.

With particular reference to FIG. 8A, the crosshair 601 is placed over the target 602 with the ballistic mode turned off. No bullet drop or windage compensation has been applied. With the ballistic mode turned off, aiming the rifle 101 is similar to aiming a scoped rifle that lacks the ballistic sight system.

With particular reference to FIG. 8B, when shooting at large distances, the shooter can first try to aim using the bullet drop compensation adjustment 201 and the windage compensation adjustment 202 of the scope 102. When the distance or the wind is too great, then movement of the reticule can be insufficient to provide the necessary compensation, as shown in FIG. 8B. As shown in FIG. 8B, the reticule 603 is bottomed out without having sufficient bullet drop compensation entered via the bullet drop compensation adjustment 201.

Alternatively, instead of attempting to use the bullet drop compensation adjustment 201 and the windage compensation adjustment 202 of the scope 102, the user can simply turn on the ballistic mode of the ballistic sight system and forego use of the bullet drop compensation adjustment 201 and the windage compensation adjustment 202 altogether. Generally, there is no need to attempt to use the bullet drop compensation adjustment 201 and the windage compensation adjustment 202 of the scope 102 when the shooter knows that greater compensation will be required than can be provided by the bullet drop compensation adjustment 201 and the windage compensation adjustment 202.

With particular reference to FIG. 8C, when sufficient bullet drop compensation or windage compensation cannot be entered using the bullet drop compensation adjustment 201 and the windage compensation adjustment 202, then the reticule 603 can be re-centered in preparation for use of the ballistic mode.

With particular reference to FIG. 8D, the ballistic mode can be turned on. If the crosshair 601 has previously been placed on the target 602 as shown in FIG. 8C, then the crosshair 601 will remain on the target 602 as shown in FIG. 8D until bullet drop compensation and/or windage compensation are entered into the ballistic sight system.

With particular reference to FIG. 8E, as bullet drop and windage compensation are entered into the camera 103, the image shifts in response. Thus, the more bullet drop compensation that is entered into the camera 103, the more the image, and consequently the target, moves upwardly (thus requiring the shooter to raise the barrel of the rifle 101 to position the crosshair 601 on the target 602). Similarly, the more windage compensation that is entered into the camera 103, the more the image, and consequently the target moves laterally (thus requiring the shooter to move the barrel of the rifle 101 sideways to position the crosshair 601 on the target 602).

As shown in FIG. 8E, the target 602 has been shifted upwardly and to the right so as to compensate for bullet drop and a right-to-left blowing wind. As a result, the rifle 101 must be moved in a manner that places the crosshair 601 over the target 602. Such movement of the crosshair 601 re-aims the rifle 101 so as to cause a bullet fired by the rifle 101 to hit the target 602.

With particular reference to FIG. 8F, the view provided by the sight 102 is shown after bullet drop and windage compensation has been entered and after the rifle 101 has been re-aimed to place the crosshair 601 over the target 602. Thus, the ballistic sight system and the rifle 101 are configured so that a bullet fired will hit the target 602.

The bullet drop compensation and the windage compensation can be entered into the ballistic sight system via the controls 507 so as to cause the processor 503 to shift the image of the display 505 from the position shown in FIG. 8D to the position shown in FIG. 8E. The controls 507 can comprise a joystick, for example. The controls 507 can comprise any desired type or combination of types of controls.

FIG. 9 shows a view through the scope 102 during calibration when a reticule 901 of the camera 103 is aligned with a reticule of the scope 102, in accordance with an embodiment of the invention. Although the camera 102 can be somewhat insensitive to mounting alignment errors (particularly when the camera 103 provides unity magnification), the camera can be aligned with respect to the scope 102 (and thus with respect to the rifle 101).

For example, the scope 102 can first be aligned with respect to the rifle 101. This can be done by bore sighting the rifle, sighting in the rifle 101 at a range, or by any other method. Once the scope 102 is aligned with respect to the rifle 101, then the camera 103 can be aligned with respect to the scope 102. For example, a reticule 901 can be shown on the display 505 of the camera 103 and the reticule 901 of the camera 103 can be moved or adjusted in position so as to move the image provided by the camera 103 into alignment with the reticule 603 of the scope 102.

The accuracy of the alignment of the camera 103 with respect to the scope 102 can be enhanced by electronically zooming the camera 102 during the alignment process. For example, electronically zooming the camera 103 can provide a ¼ pixel resolution during the alignment process.

FIGS. 10A and 10B show an electronic zoom of the camera 103 when the camera 103 is not aligned with respect to the scope 102. As shown in FIG. 10A, the crosshair 601 can be over the target 602 when the camera 103 is zoomed out. As shown in FIG. 10B, the crosshair 601 can move away from the target 602 when the camera 103 is zoomed in. Alignment of the camera 103 with respect to the scope 102 tends to keep the crosshair 601 on the target 602 when the camera 103 is electronically zoomed in, as discussed below.

FIGS. 11A and 11B show an electronic zoom of the camera 103 when the 103 is aligned with respect to the scope 102, in accordance with an embodiment of the invention. As shown in FIG. 11A, the crosshair 601 can be over the target 602 when the camera 103 is zoomed out. As shown in FIG. 11B, the crosshair 601 can remain over the target 602 when the camera 103 is zoomed in as long as the camera is aligned with respect to the scope 102. Electronic zoom can be used at any scope magnification. Electronic zoom can be used in place of higher scope magnification and has the advantage of being easier for the shooter to adjust. FIGS. 12 and 13 are shown for explanatory purposes FIGS. 12A-12D show a use of the ballistic sight system with 5× scope magnification when compensating for bullet drop, in accordance with an embodiment of the invention. The relationship between the entire image 1200 of the display 505 and an image portion 1201 that is viewed by the scope 102 is shown.

The camera 103 can provide a substantially larger entire image 1200 than the image portion 1201 because of the wider field of view of the camera 103 as compared to the field of view of the scope 102 and because of the comparatively high resolution of the display 505. The camera 103 can provide a larger image 1200 than the scope 102 views and the ballistic system can take advantage of this by moving the image portion 1201 in response to bullet drop compensation and windage compensation.

For example, the entire image 1200 can have a resolution of 1749×1000 and the image portion 1201 can have a resolution of 640×480. The longer dimension of the display can be oriented vertically to better accommodate bullet drop compensation, which at longer distances is likely to be much greater than windage compensation.

As shown in FIG. 12A, the target 602 has been sighted. As shown in FIG. 12B, the rifle 101 can be elevated to compensate for bullet drop, thus moving the crosshair 601 off of the target 602. As shown in FIG. 12C, bullet drop compensation can be entered into the camera 103 to bring the crosshair 601 onto the target 602. As shown in FIG. 12D, the camera 103 can be electronically zoomed to provide a better view of the target 602. These steps are not necessarily performed in this order during practice of the invention. Rather, the steps are shown in this order to more clearly shown the important aspects of the ballistic sight system.

The electronic zoom of the camera 103 can be applied about the point of impact of the weapon, e.g., the target 602. In this manner, the target 602 is desirably maintained at the center of the view of the scope 102.

The scope 103 can be electronically zoomed about the point of impact instead of about the center of the display 505. Electronically zooming about the target 602 instead of about the center of the display 505 provides the advantage of keeping the target substantially stationary, e.g., centered, in the display 505. Thus, the bullet impact point remains approximately centered in the image as the image is zoomed. Further, the image can be up-sampled as the image is zoomed so as to tend to maintain the quality of the image.

FIGS. 13A-13C show a use of the ballistic sight system with 25× scope magnification when compensating for bullet drop, in accordance with an embodiment of the invention. As shown in FIG. 13A, the target 602 has been sighted. AS shown in FIG. 13B, the rifle 101 can be elevated to compensate for bullet drop, thus moving the crosshair 601 off of the target. As shown in FIG. 13C, bullet drop compensation can be entered into the camera 103 to bring the crosshair 601 onto the target 602.

Figures 14A, 14B, 14C:
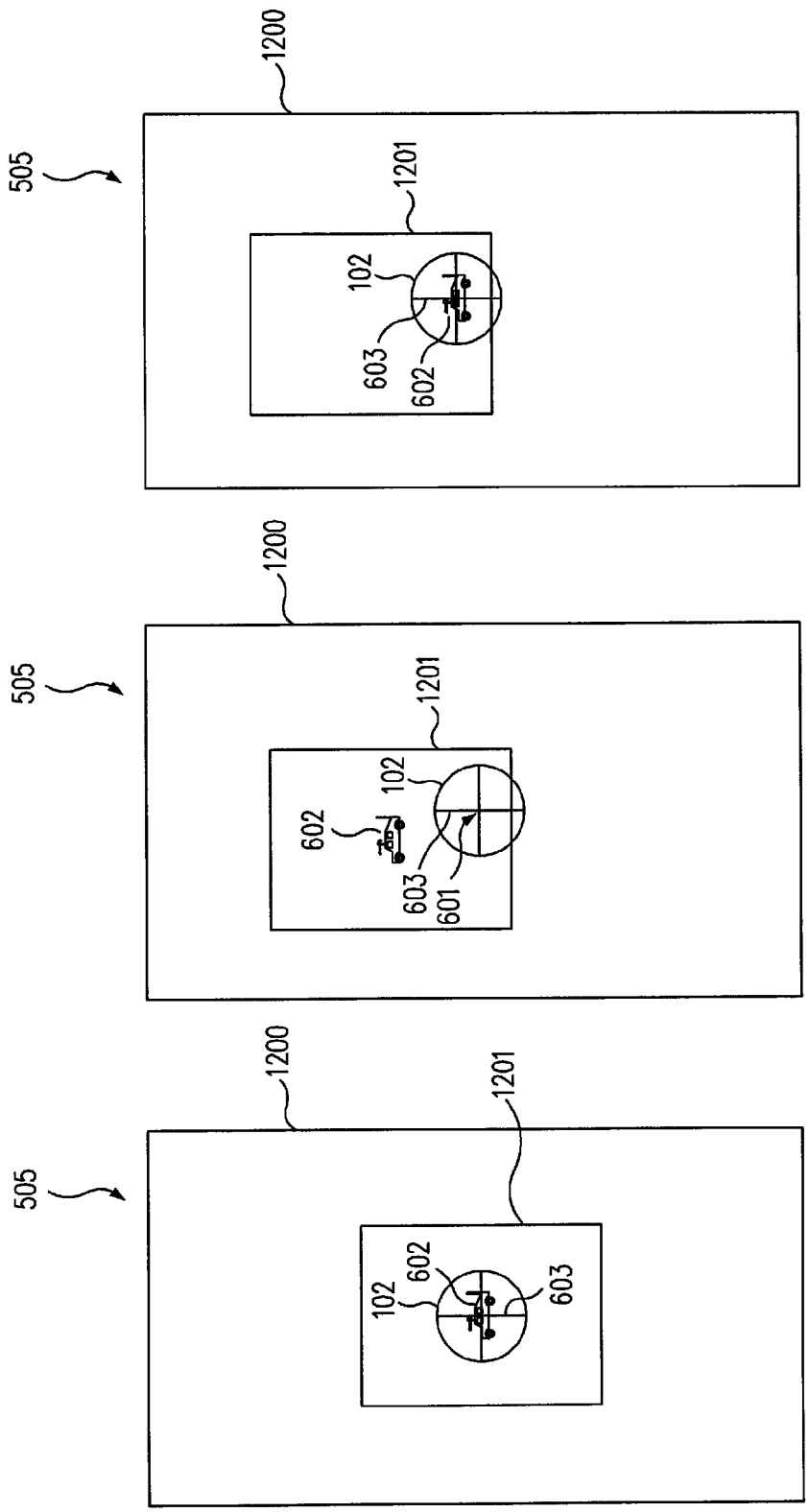
FIGS. 14A-14C show a use of the ballistic sight system with 25× scope magnification when compensating for bullet drop and windage, in accordance with an embodiment of the invention.

FIGS. 14A-14C show a use of the ballistic sight system with 25× scope magnification when compensating for bullet drop and windage, in accordance with an embodiment of the invention. As shown in FIG. 14A, the target 602 has been sighted. AS shown in FIG. 14B, predetermined bullet drop and windage compensation can be entered, thus moving the crosshair 601 off of the target 602. As shown in FIG. 14C, the firearm 101 can be re-aimed to bring the crosshair 601 onto the target 602.

Figure 15:
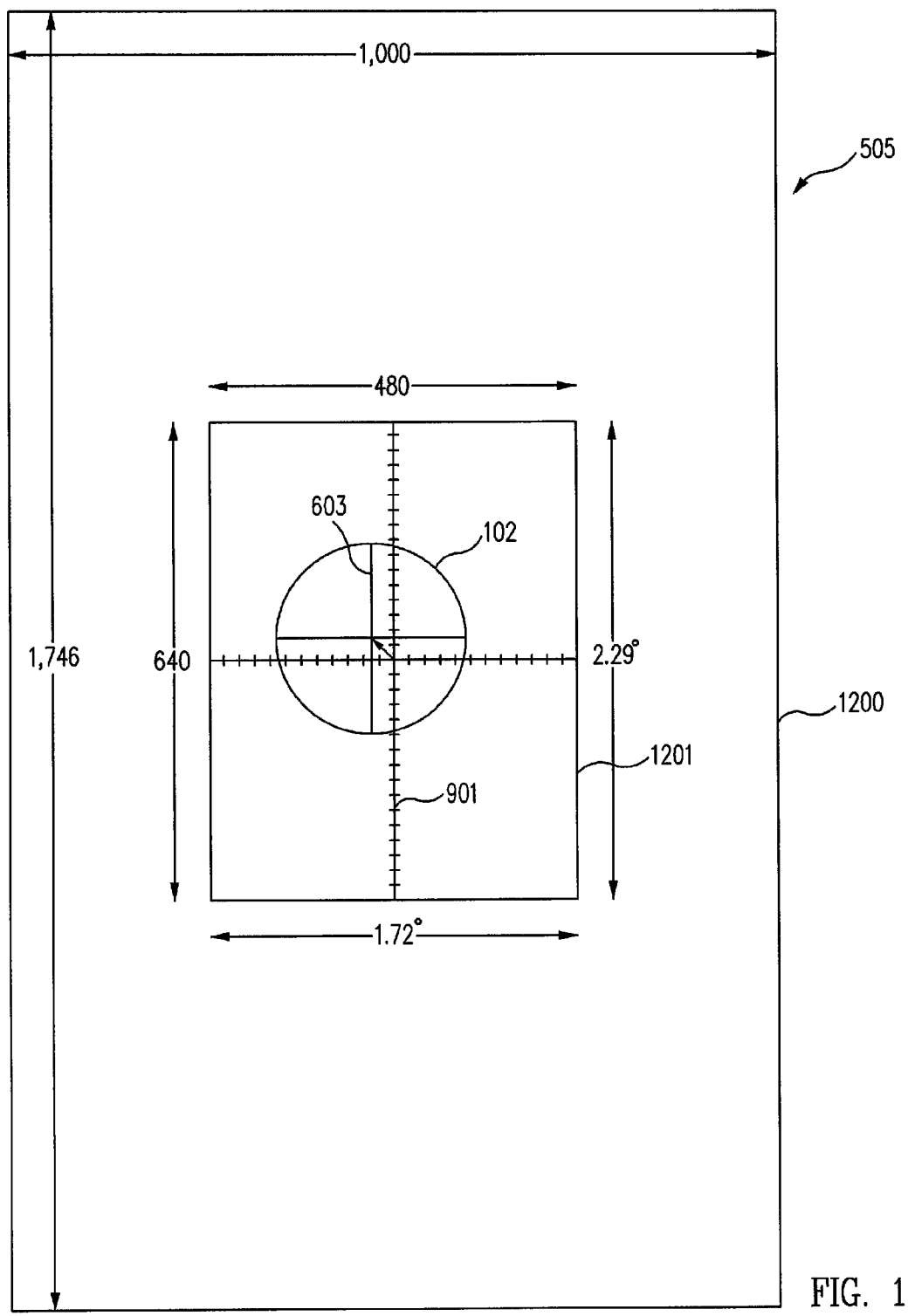
FIG. 15 shows an exemplary layout of the display, a portion of the display that is viewed by the scope, and the scope, in accordance with an embodiment of the invention.

FIG. 15 shows an exemplary layout of the display 505, an image portion 1201 shown on the display 505 that is viewed by the scope 102, and the scope 102, in accordance with an embodiment of the invention. The image portion 1201 of the display 505 that is viewed by the scope 102 can be viewed in its entirety or part of the image portion 1201 can be viewed by the scope 102, dependent on magnification of the scope.

According to an embodiment, the exemplary display 505 has a resolution of 1746×1000 and the image portion 1201 of the display 505 that is viewed by the scope 102 has a resolution of 640×480, which exactly matches the imager resolution. Both the display 505 and the image portion 1201 are oriented with the long dimension vertical to better facilitate bullet drop compensation at long shooting distances, which is likely to be substantially greater than windage compensation.

The camera reticule 901 is shown misaligned with respect to the scope reticule 603, indicating that the camera 103 is not aligned with respect to the scope 102. The camera 103 can be aligned with respect to the scope 102 during a calibration or alignment procedure, as discussed below.

Figure 16:
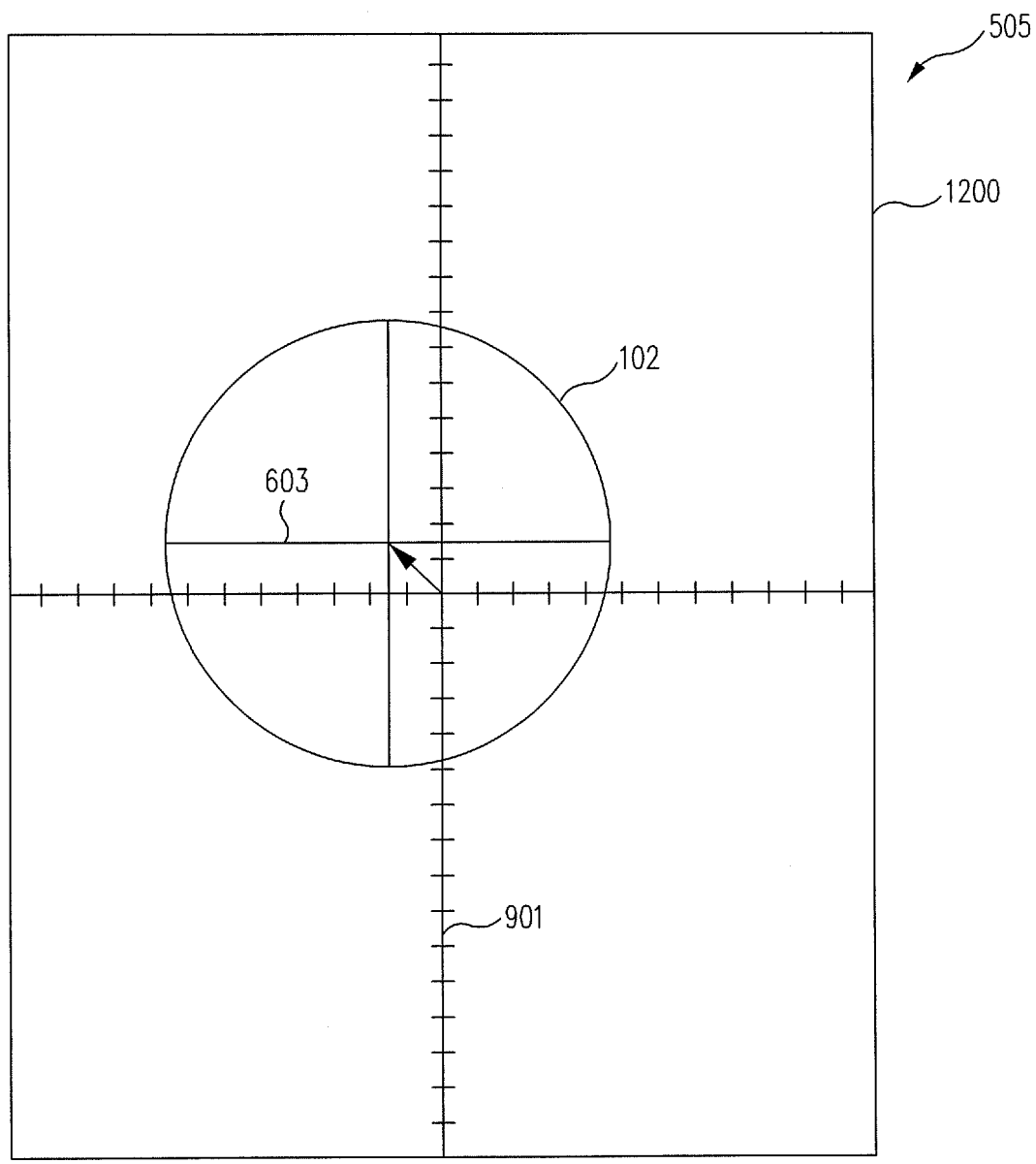
FIG. 16 shows movement a camera reticule to be coincident with a scope reticule during a calibration or alignment procedure that aligns the camera with respect to the scope, in accordance with an embodiment of the invention.

FIG. 16 shows movement of the camera reticule 901 (and consequently the camera image) to be coincident with respect to the scope reticule 603 during a calibration or alignment procedure that aligns the camera 103 with respect to the scope 102, in accordance with an embodiment of the invention. For example, the controls 507 can be used to move the camera reticule 901 into alignment with the scope reticule 603.

According to an embodiment, the camera reticule 901 is only used for this alignment procedure. The camera reticule 901 is not used for aiming the rifle 101 at the target 602.

Figure 17:
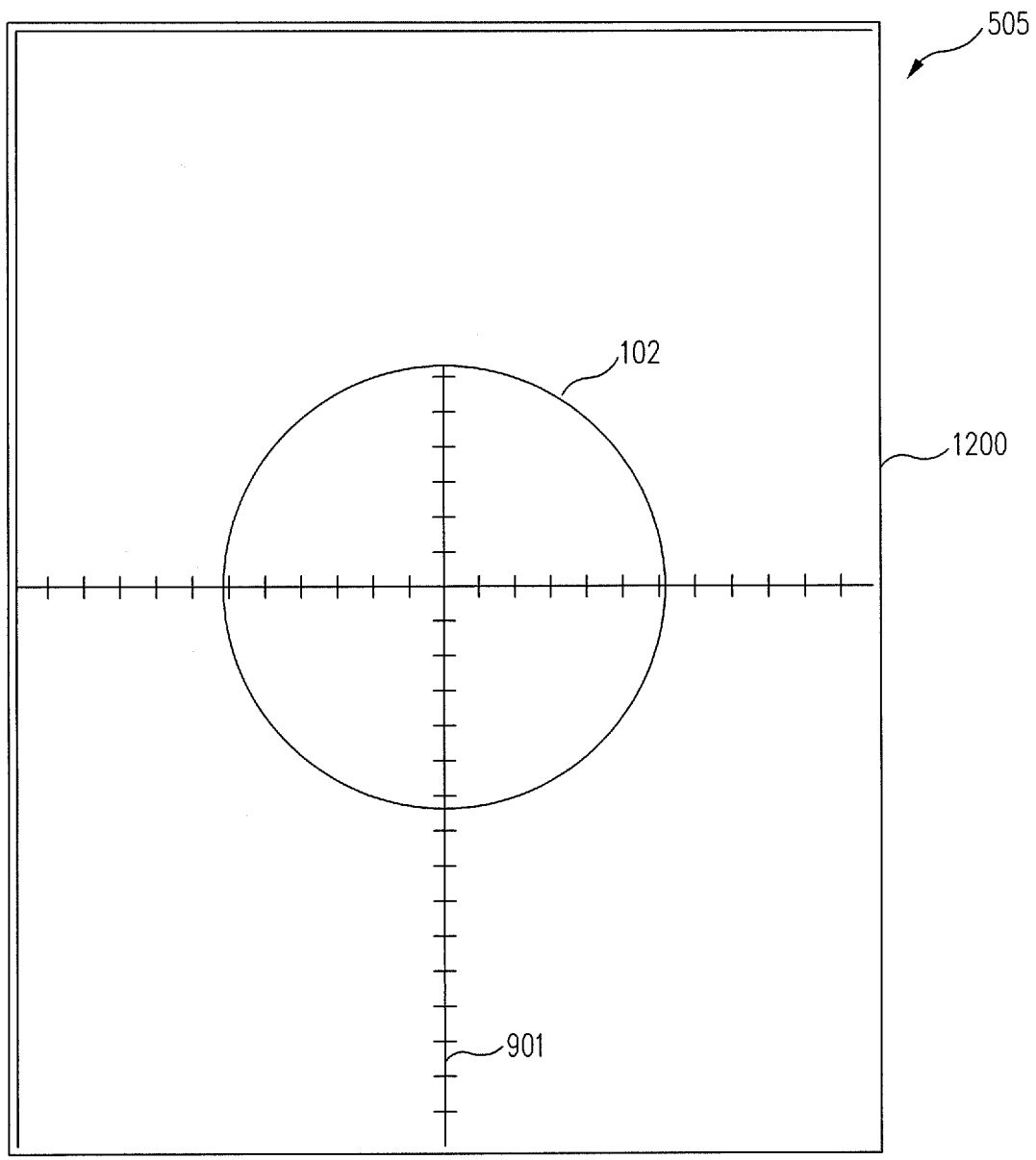
FIG. 17 shows the camera reticule aligned with the scope reticule, indicating that the camera is aligned with respect to the scope, in accordance with an embodiment of the invention.

FIG. 17 shows the camera reticule 901 aligned with respect to the scope reticule 603. This indicates that the camera 103 is aligned with respect to the scope 102, in accordance with an embodiment of the invention. At this point, the scope 102 is aligned with respect to the rifle 101 and the camera 103 is aligned with respect to the scope 102 such that an image from the camera 103 can now be used for sighting the rifle 101.

Figure 18:
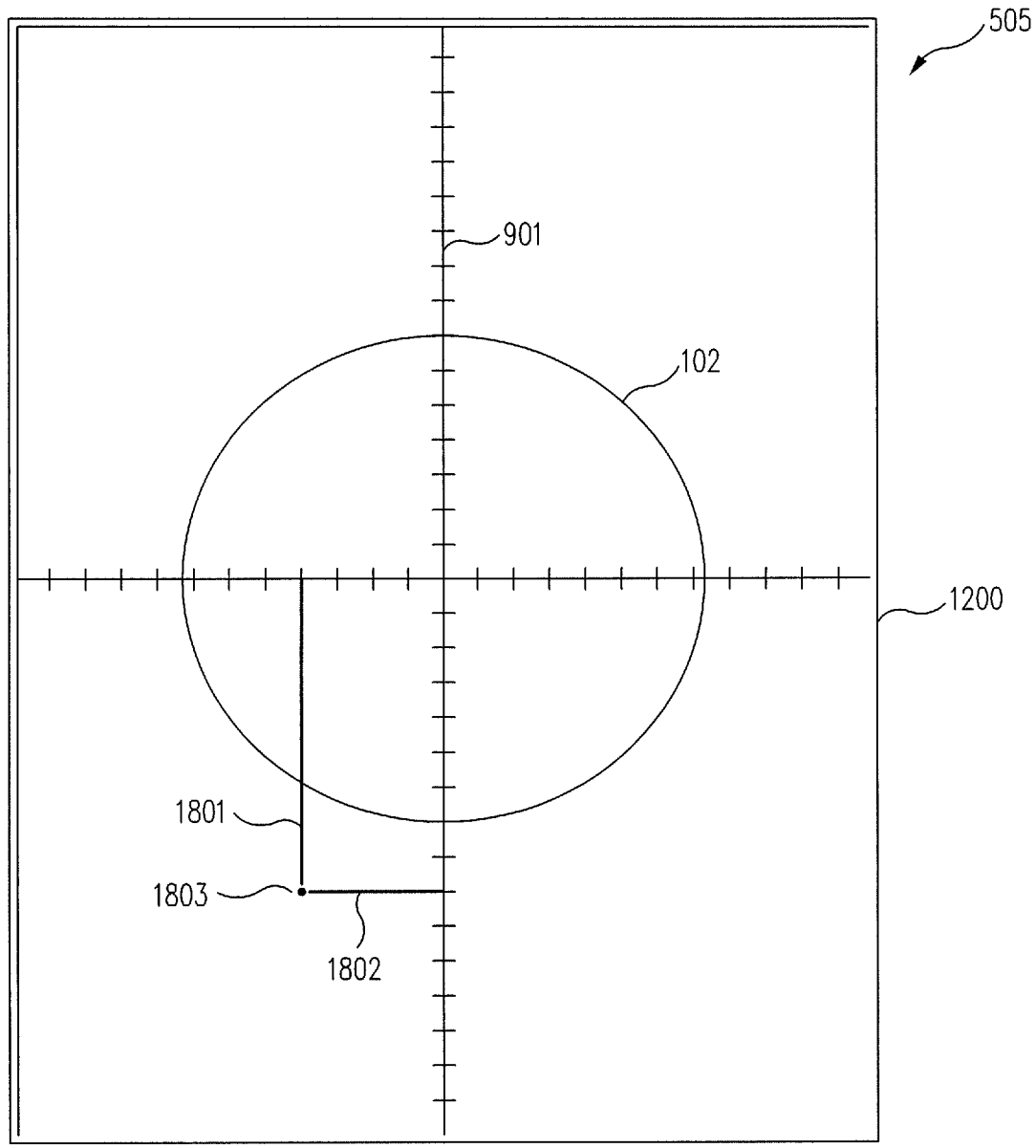
FIG. 18 shows the display after entry of the bullet drop and windage corrections and before the display has shifted to reposition the portion thereof viewed by the scope, in accordance with an embodiment of the invention.

FIG. 18 shows the display after entry of the bullet drop and windage corrections and before the display 505 has shifted to reposition the image portion 1201 (FIG. 15) thereof viewed by the scope 102, in accordance with an embodiment of the invention. The display reticule 901 is shown for scale only and is not normally displayed after the alignment procedure.

The scale can be 1.25 mils per tick mark, for example. Thus, if a shooter intends to use a bullet drop compensation of 11.2 mils and a windage correction of 5.0 mils to the left, then the shooter can enter these numbers into the processor 503 via the controls 507.

Entry of the bullet drop compensation 1801 and the windage compensation 1802 define an aim point 1803. However, due to the use of such extreme bullet drop compensation 1801, the aim point is outside of the view of the scope 102. The shooter can zoom out (demagnify) the scope 102 so that the aim point can be seen by the scope 102. However, zooming out may reduce the benefit of have a magnifying scope. In some instance, the aim point may be out of the view of the scope 120 even when the scope 120 is fully zoomed out.

The bullet drop compensation 1801, windage compensation 1802, and the aim point 1803 can be shown on the display 505. The bullet drop compensation 1801, windage compensation 1802, and the aim point 1803 can be shown graphically (like in FIG. 18) and/or can be shown numerically (such as in mils).

Figure 19:
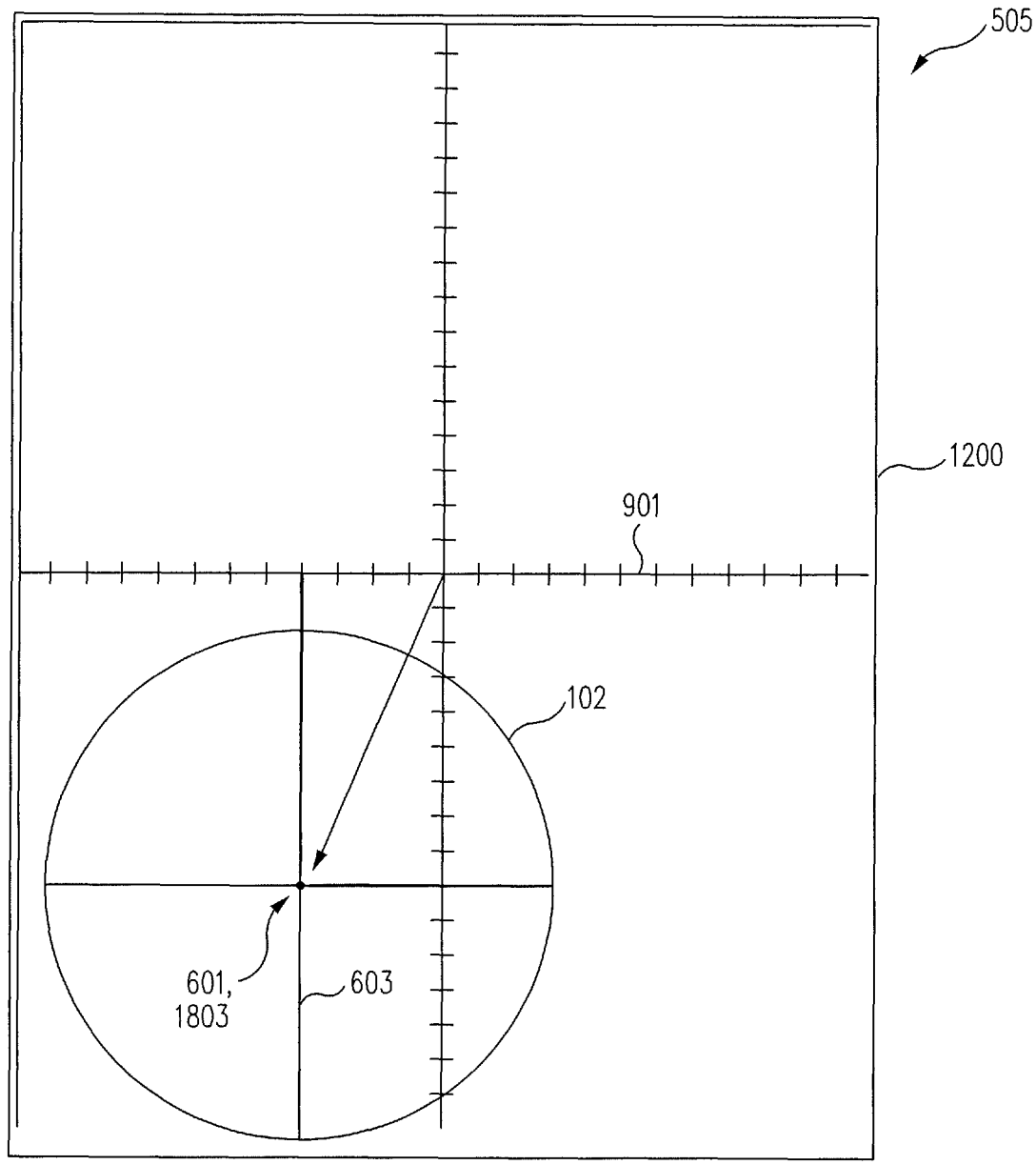
FIG. 19 shows the display after entry of the bullet drop and windage corrections and after the display has shifted to reposition the portion thereof viewed by the scope, in accordance with an embodiment of the invention.

FIG. 19 shows the display 505 after entry of the bullet drop and windage corrections and after the image 1200 of the display 505 has shifted to reposition the image portion 1201 thereof viewed by the scope 102, in accordance with an embodiment of the invention. The image 1200 of the display 505 (as well as the image portion 1201) moves in response to the entry of bullet drop and windage compensation adjustments. The image of the display 505 moves in a manner that places the crosshair 601 over the aim point 1803. Thus, the shooter can aim the rifle 101 in a normal manner even though the bullet drop and windage compensation adjustments are greater that allowed by the scope 102 alone. That is, the combination of the scope 102 and the camera 103 cooperated to provide a target image such that the shooter can aim at the target 602 simply by placing the crosshair 601 of the scope 102 over the target 602.

Figure 20A:
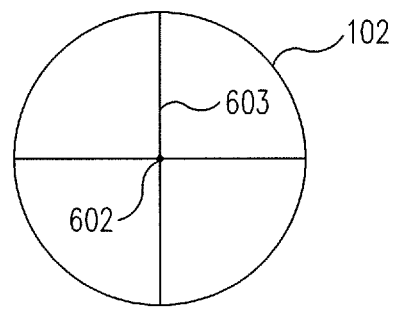
FIGS. 20A-20C show the use of a bilinear electronic zoom to maintain the position and enhance the quality of the image of the target as the image is zoomed, in accordance with an embodiment of the invention.
Figure 20B:
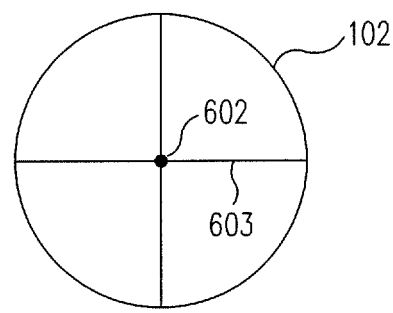
Figure 20C:
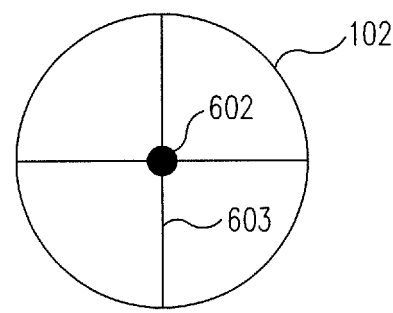

FIGS. 20A-20C show the use of a bilinear electronic zoom to enhance the resolution of the image of the target 602 as the image is zoomed, in accordance with an embodiment of the invention. The bilinear electronic zoom allows the image shown upon the display 505 to be zoomed in and out while keeping the target 602 centered in the scope 102.

According to contemporary practice, when a camera is zoomed, the image displayed thereby is enlarged or reduced in size about a center of the display, e.g., a center of the image. However, since different image portions 1201 of the display 505 are viewed by the scope 102, the target 602 is not necessarily located at the center of the image shown on the display 505. Thus, contemporary zooming would tend to ruin the sight picture by moving the target undesirably on the display 505.

Therefore, instead of zooming about the center of the display 505, the camera 103 can zoom about the point of impact regardless of where the point of impact 602 is on the display 505. In this manner, the point of impact is kept aligned to the scope reticule.

To zoom the image about the target 602, the target 602 must be at the aim point of the ballistic sighting system, as defined by any bullet drop and windage compensation that has been applied to the camera 103. Such zooming about the target 602 is performed about the aim point and thus is also about the target 602 when the target 602 is coincident with the aim point.

The image shown on the display 505 can be up-sampled to avoid pixelation and to provide enhanced viewing thereof as the image is zoomed. Such up-sampling can use standard interpolation and curve-smoothing algorithms. Thus, the image can have an apparent resolution that can be substantially greater than the actual resolution of the image. The image can be down-sampled as the image is zoomed out.

The image, rather than or in addition to the scope reticule 603, can be moved to compensate for bullet drop and windage. The use of a high resolution allows the scope to view only a portion of the display with adequate resolution to facilitate accurate shooting. In this manner, the image can be moved such that the scope can view different portions of the display to provide bullet drop and windage compensation. Thus, the use of a high resolution display facilitates movement of the image. The use of a high resolution display also facilitates of the image.

As discussed above, the target can be kept approximately centered in a field of view of the scope 102 when the target 602 is at a sufficient distance from the shooter that a scope reticule 603 cannot be moved far enough to compensate for windage and/or bullet drop.

The methods and systems disclosed herein better facilitate shooting at targets at extended distances. The methods and systems disclosed herein also better facilitate shooting at target at extended distances under very windy conditions and under limited light conditions, such as at night. Since the target 602 is kept generally centered in the display 505, higher magnifications can be used, the need to zoom out or demagnify is reduced, and greater shooting accuracy can be achieved.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A system comprising:
a camera configured to mount to a firearm;
a display configured to show an image from the camera;
a scope configured to mount to the firearm and configured to view the display; and
wherein the image from the camera is movable on the display to facilitate compensation for bullet drop and windage.

2. The system of claim 1, wherein the camera is a thermal imaging camera, and wherein the camera comprises a processor configured to move the image on the display to facilitate greater compensation for bullet drop and windage than a compensation for bullet drop and windage provided by the scope.

3. The system of claim 1, wherein a field of view of the camera is wider than a field of view of the scope.

4. The system of claim 1, further comprising a scope reticule and wherein the camera and the scope are alignable with respect to one another such that the scope reticule facilitates aiming of the firearm by viewing the scope reticule on the image.

5. The system of claim 1, further comprising a camera reticule configured to facilitate alignment of the camera to the scope.

6. The system of claim 1, wherein the camera and the scope are configured to mount in line with each other on the firearm.

7. The system of claim 1, wherein high scope magnification is usable in combination with moving the image on the display to provide bullet drop compensation for use at long ranges.

8. The system of claim 1, wherein the camera has a normal mode in which the image is fixed, and has a ballistic mode in which the image is moveable to compensate for bullet drop and windage.

9. The system of claim 1, wherein the camera has a normal mode in which the image is fixed, and has a ballistic mode in which the image moves to keep a bullet impact point approximately centered within a field of view of the scope.

10. The system of claim 1, wherein:
the camera has a normal mode in which the image is fixed, and has a ballistic mode in which the image moves to keep a bullet impact point approximately centered within a field of view of the camera; and
the camera is configured to be switched from the normal mode to the ballistic mode when a scope reticule cannot move sufficiently to place a crosshair of the scope reticule on a target due to windage and/or bullet drop compensation.

11. The system of claim 1, further comprising:
a control for entering bullet drop and windage corrections; and
wherein the image moves in response to the control to keep a bullet impact point approximately centered within the field of view of the scope.

12. The system of claim 1, further comprising:
a joystick for entering bullet drop and windage corrections; and
wherein the image moves in response to the joystick to keep a bullet impact point approximately centered within the field of view of the scope.

13. The system of claim 1, further comprising:
a processor;
a joystick for providing bullet drop and windage corrections to the processor; and
wherein the processor moves the image in response to the joystick to keep a bullet impact point approximately centered within the field of view of the camera in response to the bullet drop and windage corrections.

14. The system of claim 1, further comprising:
a processor configured to electronically zoom the image; and
wherein the processor is configured to maintain a bullet impact point of the image centered in the field of view of the scope as the image is zoomed.

15. The system of claim 1, further comprising:
a processor configured to electronically zoom the image; and
wherein the processor is configured to upsample the image as the image is zoomed.

16. The system of claim 1, further comprising:
a firearm; and
wherein the scope and the camera are mounted to the firearm, the scope is aligned with respect to the firearm, and the camera is aligned with respect to the scope such that the scope is configured to view the display.

17. A method comprising:
mounting a scope to a firearm;
aligning the scope to the firearm;
mounting a camera to the firearm;
aligning the camera to the scope; and
wherein the camera has a display configured to show an image from the camera, the scope is configured to view the display, a field of view of the camera is wider than a field of view of the scope, and wherein the image from the camera is movable on the display to facilitate greater compensation for bullet drop and windage than a compensation provided by the scope.

18. The method of claim 17, wherein aligning the camera to the scope comprises turning on a camera reticule and aligning the camera reticule to a scope reticule.

19. A method comprising:
configuring a camera from a normal mode to a ballistic mode;
aiming at a target by placing a crosshair of a scope on an image of the target displayed by the camera; and
wherein in the ballistic mode the image is movable to facilitate greater field of view and compensation for bullet drop and windage than a compensation provided by the scope.

20. The method of claim 19, further comprising entering sufficient bullet drop and windage compensation to cause a scope reticule to move out of a field of view of the scope if the camera had been in the normal mode.

21. The method of claim 19, further comprising viewing a moved image displayed from the camera with the scope.

22. The method of claim 19, further comprising:
electronically zooming the image; and
wherein the image is up-sampled and a bullet impact point remains centered in the scope as the image is zoomed.

* * * * *